United States Patent
Sakata

(10) Patent No.: US 6,835,074 B2
(45) Date of Patent: Dec. 28, 2004

(54) JIG FOR PRESS-FITTING TERMINALS AND A PRESS-FITTING APPARATUS

(75) Inventor: Tomoyuki Sakata, Nagoya (JP)

(73) Assignees: Autonetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/724,087

(22) Filed: Dec. 1, 2003

(65) Prior Publication Data

US 2004/0115970 A1 Jun. 17, 2004

(30) Foreign Application Priority Data

Dec. 12, 2002 (JP) ..................................... 2002-360240

(51) Int. Cl.[7] .............................................. H01R 9/09
(52) U.S. Cl. ....................................... 439/79; 439/943
(58) Field of Search ...................... 439/79, 80, 733.1, 439/943

(56) References Cited

U.S. PATENT DOCUMENTS

| | | | |
|---|---|---|---|
| 4,550,962 A | * | 11/1985 | Czeschka ..................... 439/78 |
| 5,400,502 A | | 3/1995 | Ota et al. |
| 5,453,016 A | * | 9/1995 | Clark et al. ..................... 439/79 |
| 5,980,271 A | * | 11/1999 | MacDougall et al. ......... 439/78 |
| 6,062,877 A | | 5/2000 | Makino et al. |
| 6,319,023 B2 | * | 11/2001 | Goto et al. ..................... 439/79 |
| 6,719,573 B2 | * | 4/2004 | Koehler et al. ............... 439/79 |

FOREIGN PATENT DOCUMENTS

| | | |
|---|---|---|
| JP | A 6-224597 | 8/1994 |
| JP | A 10-41026 | 2/1998 |

* cited by examiner

*Primary Examiner*—Thanh-Tam Le
(74) *Attorney, Agent, or Firm*—Oliff & Berridge, PLC

(57) ABSTRACT

A jig for holding terminals of a connector, the terminals each having a horizontal part extending in a horizontal direction from a main body of the connector and a vertical part extending in a vertical direction and connected with the horizontal part at a lower portion, and a flange at an upper portion of the vertical part. The jig has a predetermined number of widthwise positioning grooves formed in the main body and arrayed in a widthwise direction of the main body, the widthwise positioning groove being adapted for holding the horizontal part and a lower portion of the vertical part of each terminal; and a predetermined number of back and forth positioning grooves formed in the main body and arrayed in a back and forth direction of the main body, the back and forth positioning groove being adapted for holding the flange of each terminal.

16 Claims, 8 Drawing Sheets

FIG.1A
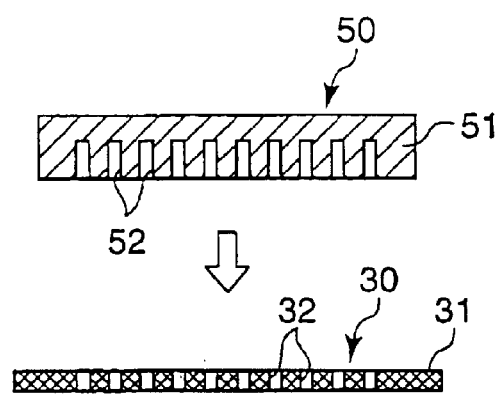
FIG.1B
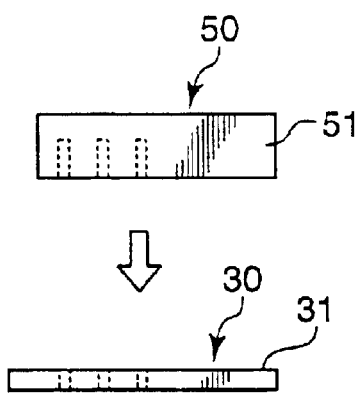
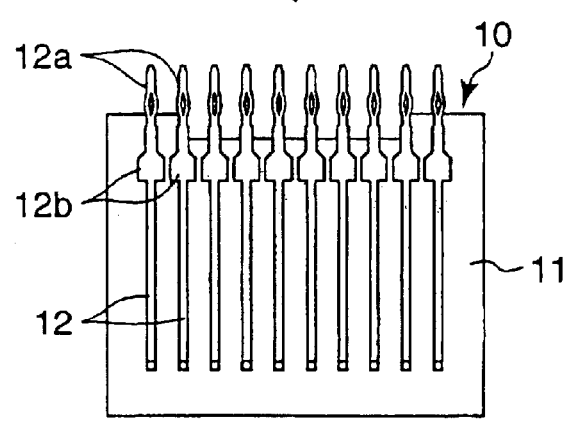
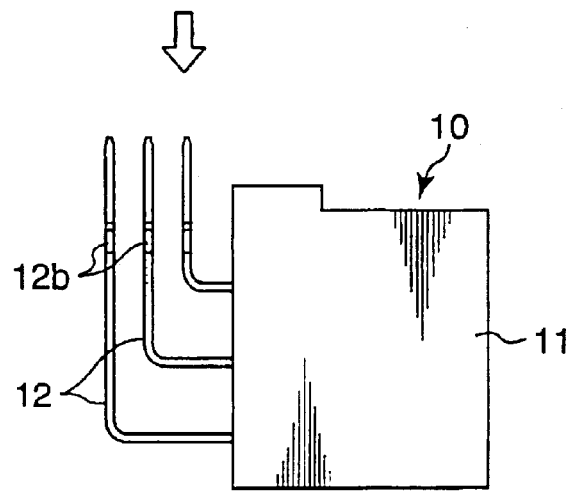
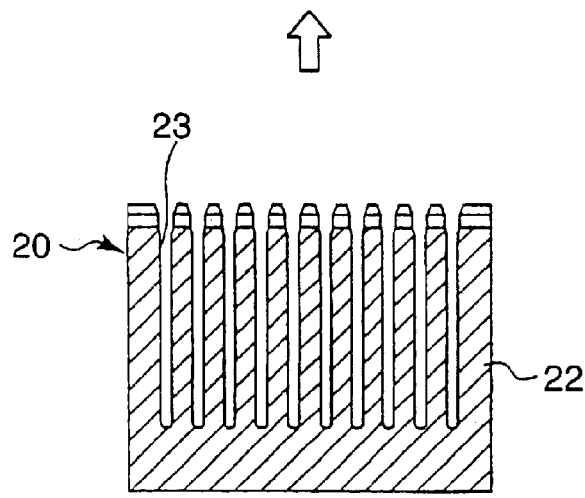
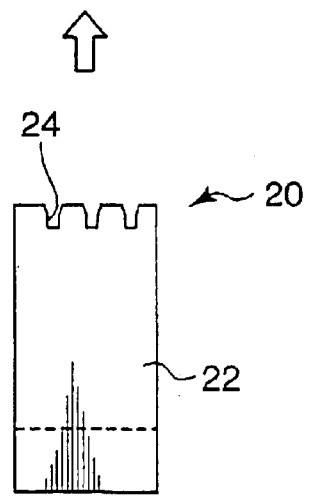

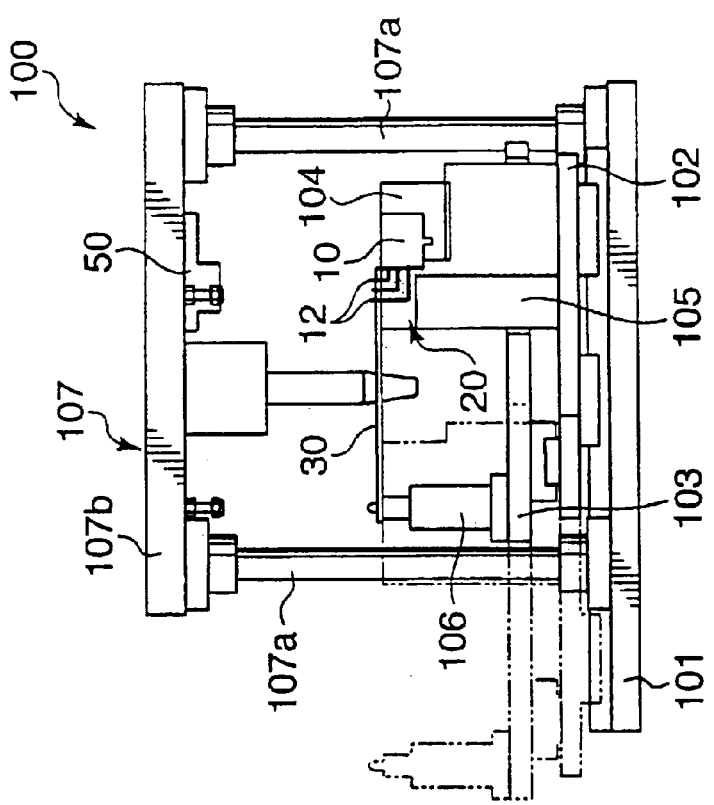
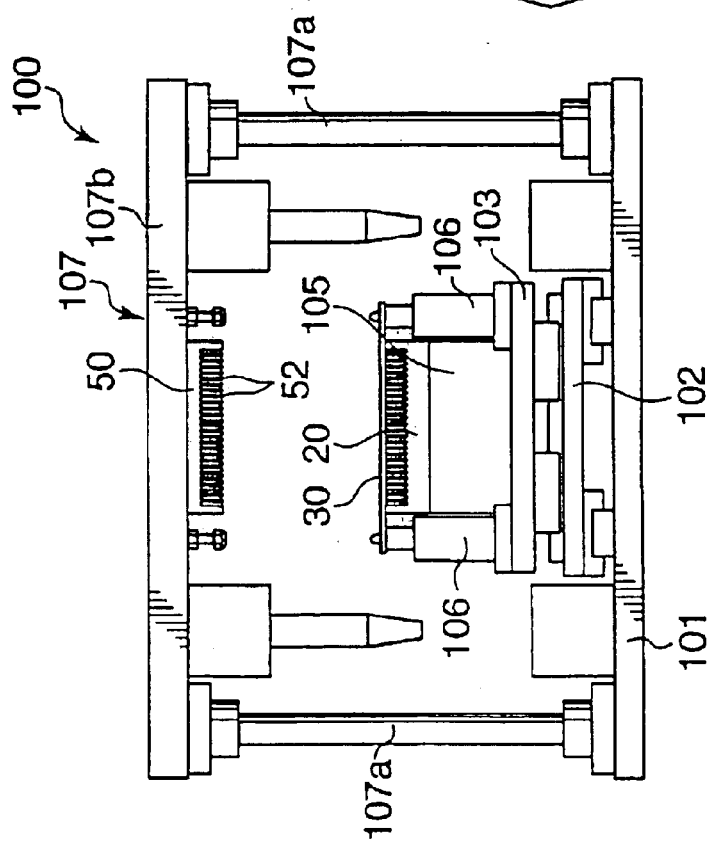

PRIOR ART
FIG.10A
PRIOR ART
FIG.10B
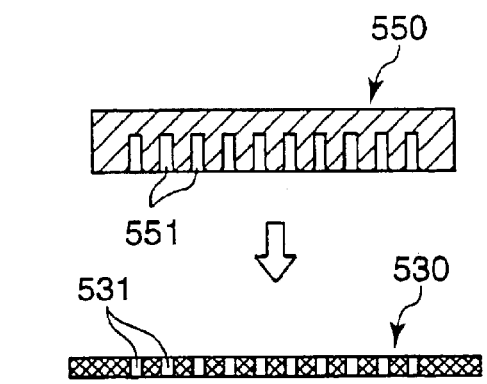
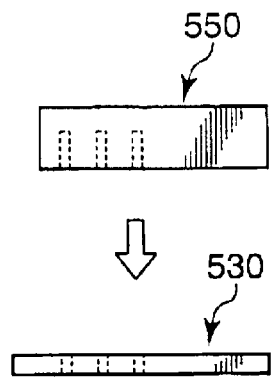
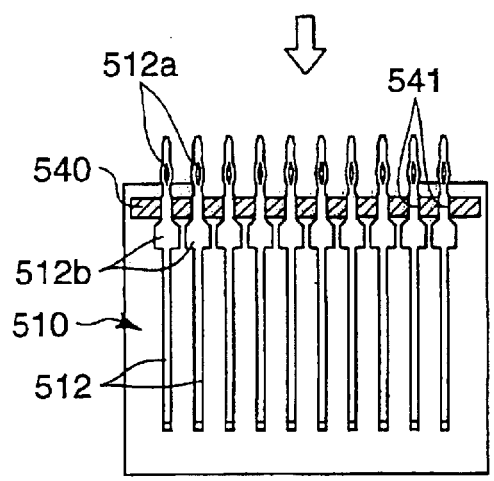
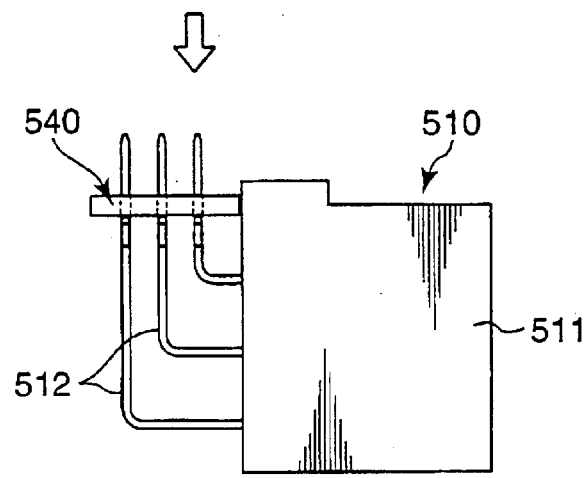
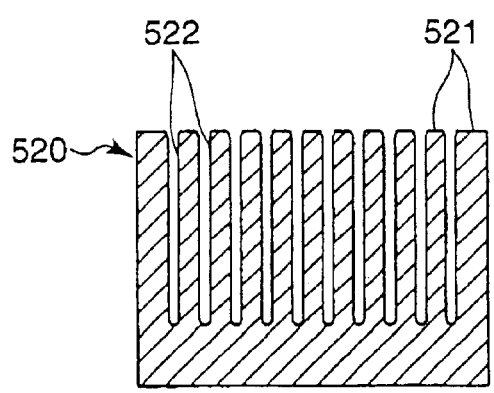
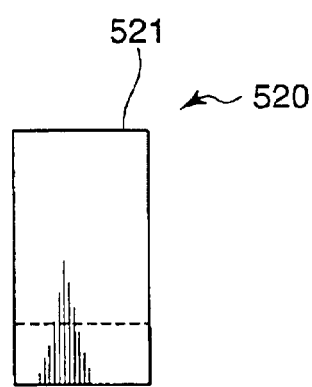

JIG FOR PRESS-FITTING TERMINALS AND A PRESS-FITTING APPARATUS

BACKGROUND OF THE INVENTION

1. Field of the Invention

The present invention relates to a jig for press-fitting terminals of a connector such as a press fit connector into a substrate such as a printed circuit board, and a press-fitting apparatus.

2. Description of the Related Art

A conventional arrangement is described with reference to FIGS. 10A through 1C. FIGS. 10A and 10B illustrate press-fitting of a press fit connector into a substrate, specifically, FIG. 10A illustrating the press-fitting on front view, and FIG. 10B illustrating the press-fitting on side view. It should be noted that the hollow arrows in FIGS. 10A and 10B indicate the directions along which respective components are assembled together in the press-fitting. FIGS. 11A through 11C show a detailed construction of a conventional jig, specifically, FIG. 11A being a plan view of the jig, FIG. 11B being a cross section view taken along the line XIB—XIB in FIG. 11A, and FIG. 11C being a cross sectional view taken along the line XIC—XIC in FIG. 11A.

Heretofore, the so-called press fit connector (PFC) has been widely used as a connector that accomplishes easy connection by press-fitting terminals into a substrate without soldering. Also, a method of press-fitting terminals into a substrate has been known, as shown in FIGS. 10A and 10B, for example. According to the known press-fitting method, a number of bent-up terminals 512 of a press fit connector 510 are press fitted into a printed circuit board 530 by inserting the terminals 512 extending from a housing 511 of the press fit connector 510 into holding grooves 522 formed in a widthwise direction of a jig 520 while rendering bottom surfaces of respective flanges 512b of the terminals 512 in contact with a top surface 521 of the jig 520, and by press-fitting respective top end portions of the terminals into respective connection holes 531 of the printed circuit board 530. The top end portion of each terminal 512 has a resilient projection 512a. Indicated at 550 is another jig to support the printed circuit board 530 on the top. The jig 550 is formed with holes 551 corresponding to the connection holes 531 of the printed circuit board 530. The respective top ends of the terminals 512 come into the holes 551 to be thereby protected when the press-fitting is carried out.

As shown in FIG. 10A through 11B, the jig 520 is formed with the holding grooves 522 only in the widthwise direction. Accordingly, the terminals 512 can be securely positioned in the-widthwise direction of the jig 520 owing to the holding grooves 522 arranged in the widthwise direction. However, it will be seen to be difficult or impossible to position the terminals 512 in the back and forth direction of the connector jig 520 because no constraint is provided in the back and forth direction of the jig 520.

To accurately insert the respective terminals 512 into the connection holes 531 of the printed circuit board 530, accordingly, the respective terminals 512 are required to be positioned relative to the corresponding connection holes 531 of the printed circuit board 530 not only in the widthwise direction of the jig 520 but also in the back and forth direction of the jig 520. For this reason, as shown in FIGS. 10A and 10B, an alignment plate 540 is used to align the respective terminals 512 in the back and forth direction by permitting the respective terminals 512 to pass through holes 541 formed in the alignment plate 540. This manner is adopted in connection of terminals with the so-called pin connector, in which the respective terminals are bonded to a substrate by soldering, as shown in Japanese Unexamined Patent Publication Nos. 6-224597 and 10-41026.

In the above arrangement, the alignment plate 540 is a separate component from the housing 511 of the press fit connector 510, which consequently causes the increased time and cost in connection of a connector with a printed circuit board.

Further, the alignment plate 540 is not removed even after the press fit connector 510 is assembled. Accordingly, there have been the following problems. The terminals of the press fit connector mounted on an automotive vehicle receive vibrations resulting from the alignment plate 540 or excessive thermal expansion/compression forces resulting from differences in the chemical/physical material properties between the alignment plate 540 and other components of the connector 510, resulting in a likelihood that the resilient projections 512a of the respective terminals 512 come off from the connection holes 531 of the printed circuit board 530 without external force. In the case of a pin connector bonded to a printed circuit board by soldering, also, it is highly likely that an excessive force is exerted to the soldered part, which may result in a crack. Thus, the connector may lose its mechanical precision or reliability due to these drawbacks. Japanese Unexamined Patent Publication No. 10-41026 proposes an improved alignment plate to eliminate these drawbacks. However, even such improved alignment plate cannot eliminate the additional production cost of an alignment plate.

SUMMARY OF THE INVENTION

It is an object of the present invention to provide a connector terminal jig and press-fitting apparatus which are free from the problems residing in the prior art.

It is another object of the present invention to provide a connector terminal jig and press-fitting apparatus which enable press-fitting of connector terminals into a substrate at a reduced cost and with improved reliability without use of an alignment plate.

According to an aspect of the invention, a jig is adapted for holding terminals provided on a connector. The terminals each have a horizontal part extending in a horizontal direction from a main body of the connector and a vertical part extending in a vertical direction and connected with the horizontal part at a lower portion, and a flange at an upper portion of the vertical part. The jig is provided with widthwise positioning grooves formed in a connector main body and arrayed in a widthwise direction of the main body for holding the horizontal part and a lower portion of the vertical part of each terminal; and back and forth positioning grooves formed in the main body and arrayed in a back and forth direction of the main body for holding the flange of each terminal.

These and other objects, features and advantages of the present invention will become more apparent upon reading of the following detailed description along with the accompanying drawings.

BRIEF DESCRIPTION OF THE DRAWINGS

FIGS. 1A and 1B are illustrations showing press-fitting of connecter terminals into a substrate, wherein FIG. 1A shows the press-fitting on front view, and FIG. 1B shows the press-fitting on side view;

FIG. 3A is a front view of a press-fitting apparatus mounted with the jig;

FIG. 3B is a side view of the press-fitting apparatus;

FIGS. 4A and 4B show a first step of press-fitting connector terminals into a substrate with use of the jig, wherein FIG. 4A shows it on front view, and FIG. 4B shows it on side view;

FIGS. 5A and 5B show a second step of the press-fitting, wherein FIG. 5A shows it on front view, and FIG. 5B shows it on side view;

FIGS. 6A and 6B show a third step of the press-fitting, wherein FIG. 6A shows on front view, and FIG. 6B shows on side view;

FIGS. 7A and 7B show a fourth step of the press-fitting, wherein FIG. 7A shows on front view, and FIG. 7B show on side view;

FIGS. 8A and 8B are perspective views showing holding of terminals by the jig, wherein FIG. 8A shows a state before the terminals are held, and FIG. 8B shows a state after the terminals are held;

FIGS. 9A and 9B are partially enlarged views showing a state that a terminal is held in a holding groove of the jig, wherein FIG. 9A shows it on front view, and FIG. 9B shows it on side view;

FIGS. 10A and 10B show press-fitting using a conventional jig, wherein FIG. 10A shows the press-fitting on front view, and FIG. 10B shows the press-fitting on side view;

DETAILED DESCRIPTION OF THE PREFERRED EMBODIMENTS OF THE INVENTION

Figure 2A:
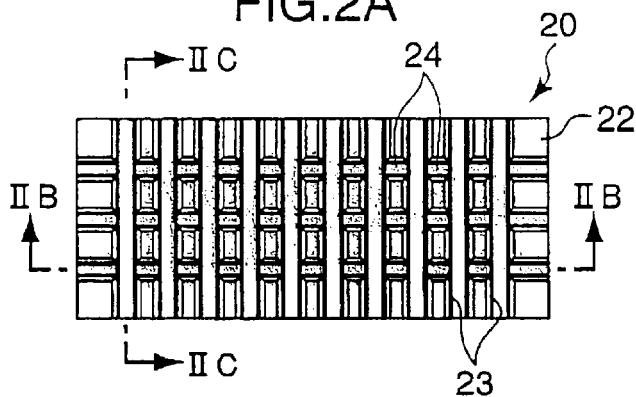
FIG. 2A is a plan view of a jig.
Figure 2B:
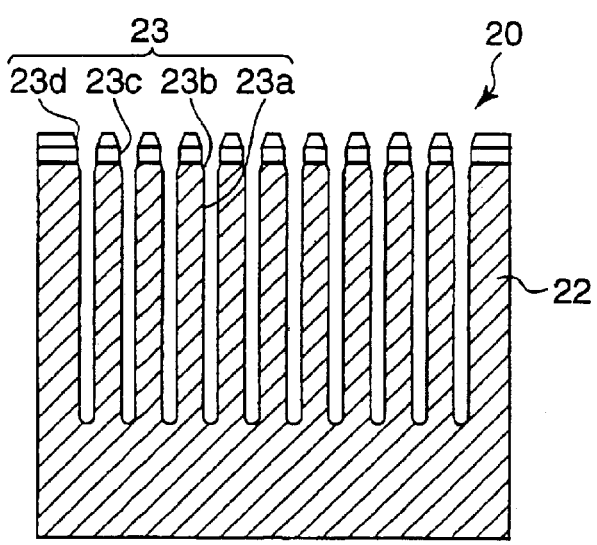
FIG. 2B is a cross sectional view taken along the line IIB—IIB in FIG. 2A.
Figure 2C:
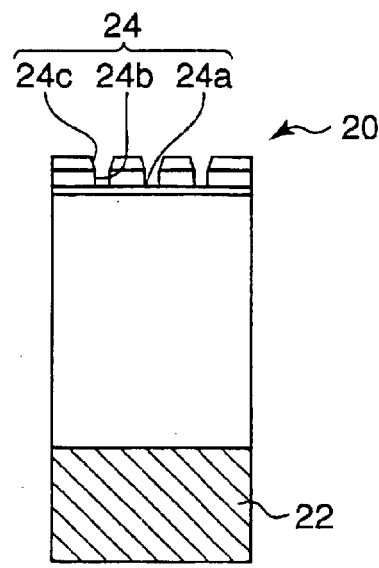
FIG. 2C is a cross sectional view taken along the line IIC—IIC in FIG. 2A.
Figure 2D:
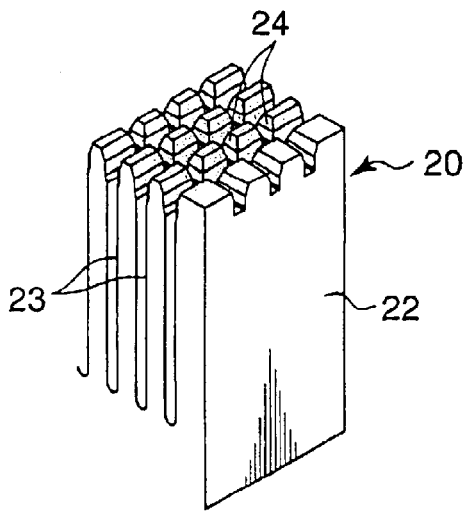
FIG. 2D is a perspective view showing a part of the jig.
Figure 2E:
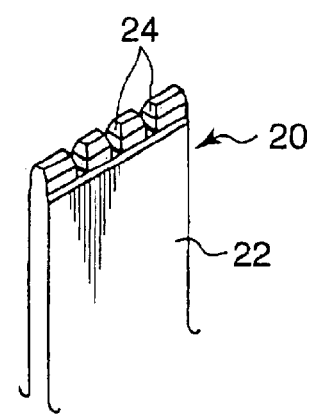
FIG. 2E is a perspective view showing a part of a partition wall of the jig.

Referring to FIGS. 1A and 1B showing a state before terminals of a press fit connector are press fitted into a substrate according to an embodiment of the present invention, indicated at 10 is a press fit connector, indicated at 20 is a connector jig serving as a jig for press-fitting terminals of the press fit connector 10 into a substrate or printed circuit board 30, and indicated at 50 is a substrate jig. It should be noted that the hollow arrows in FIGS. 1A and 1B indicate the directions along which the press fit connector 10 and the substrate 30 are assembled together in press-fitting.

The press fit connector 10 includes a generally parallelepiped housing 11 of a synthetic resin, and metallic pin-like terminals 12 extending parallel to each other from the housing 11. Each terminal 12 has an L-shape on side view, including a horizontal part extending by a certain distance and a vertical part extending upwardly from the horizontal part substantially at a right angle. In this embodiment, the connector 10 is provided with ten terminals 12 arrayed in a widthwise direction of the connector 10. Adjacent three terminals 12 are arranged in three different rows as shown in FIG. 1B to keep adjacent terminals 12 from interfering with each other. The shape and the number of the terminals 12 differ depending on the kind and the size of a press fit connector 10. It should be needless to say that the present invention may be applicable for a variety of different connectors.

Each terminal 12 is formed with a resilient bulge portion 12a having a needle-eye-like hollow in the vicinity of a tip end thereof to be resiliently fitted into a corresponding through connection hole 32 formed in the printed circuit board 30. The terminal 12 is formed with a flange 12b at an intermediate portion of the vertical part thereof. The flange 12b comes into contact with a back and forth positioning groove 24 of the connector jig 20 as to be described below.

The connector jig 20 is adapted to support the respective terminals 12 in press-fitting the terminals 12 into the printed circuit board 30. The connector jig 20 includes a generally parallelepiped metallic main body 22, a predetermined number of widthwise positioning grooves (in this embodiment, 10 grooves) 23 arrayed in the widthwise direction of the connector jig 20, and a predetermined number of back and forth positioning grooves (in this embodiment, 3 grooves) 24 arrayed in the back and forth direction of the connector jig 20. In other words, the connector jig 20 appears a comb shape on front view, having an array of deep grooves, and a comb shape on side view, having an array of shallow grooves.

The printed circuit board 30 includes a substrate main body 31 having a small thickness, and formed with the through connection holes 32 in the substrate main body 31. The terminals 12 correspond to the through connection holes 32.

The substrate jig 50 is adapted to secure press-fitting of the connector 10 into the printed circuit board 30. The substrate jig 50 includes a jig main body 51. The jig main body 51 is formed with a number of blind holes 52 for receiving the terminals 12 which have passed through the through connection holes 32 of the printed circuit board 30 for protecting the tip ends of the terminals 12.

Referring to FIGS. 2A through 2E showing a detailed construction of the connector jig 20, each of the widthwise positioning grooves 23 is defined by opposite first surfaces 23a, opposite second surfaces 23b, opposite third surfaces 23c, and opposite fourth surfaces 23d, respectively. The first surfaces 23a are parallel to each other and serve to align the horizontal part and a lower section of the vertical parts of the terminal 12 in the widthwise direction of the connector jig 20. The opposite second surfaces 23b, third surfaces 23c, fourth surfaces 23d define an introduction portion for ensuring smooth insertion of the terminal 12 into the widthwise positioning groove 23. Specifically, the opposite second and fourth surfaces 23b and 23d are slanted in such a way that the space width increases in the upward direction. The opposite third surfaces 23c define a space having a width larger than the width of the space defined by the opposite surfaces 23a.

Each of the back and forth positioning grooves 24 is defined by a bottom surface 24a, opposite first surfaces 24b, and opposite second surfaces 24c, respectively. The opposite first surfaces 24b are parallel to each other. The opposite second surfaces 24c are slanted in such a way that the space width of the groove 24 increases in the upper direction. The opposite second surfaces 24c may be curved. The opposite second surfaces 24c define an introduction portion of the back and forth positioning groove 24.

In this construction, the respective terminals 12 are smoothly guided along the opposite fourth, third, second surfaces 23d, 23c, 23b, and the first opposite surfaces 23a to be thereby aligned in the widthwise direction of the connector jig 20. At the same time, the respective terminals 12 are guided along the opposite second and first surfaces 24c and 24b to be thereby aligned in the back and forth direction of the connector jig 20 with the flange 12b coming into contact with the bottom surface 24a.

As shown in FIG. 1B, each of the terminals 12 has an L-shape on side view, and adjacent three terminals 12 are displaced from each other by a certain pitch in the back and forth direction of the connector jig 20.

Figure 2F:
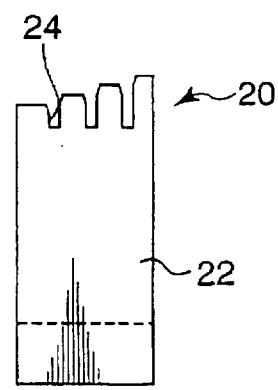
FIG. 2F is a side view showing a modified connector terminal jig.
Figure 4A:
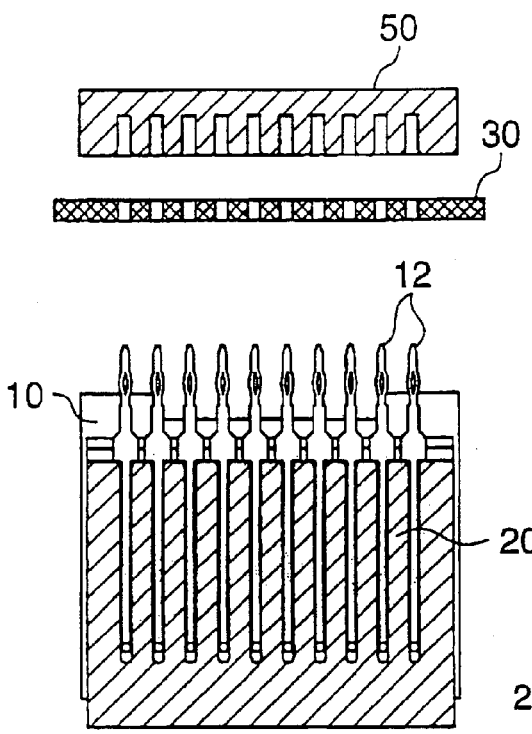
Figure 4B:
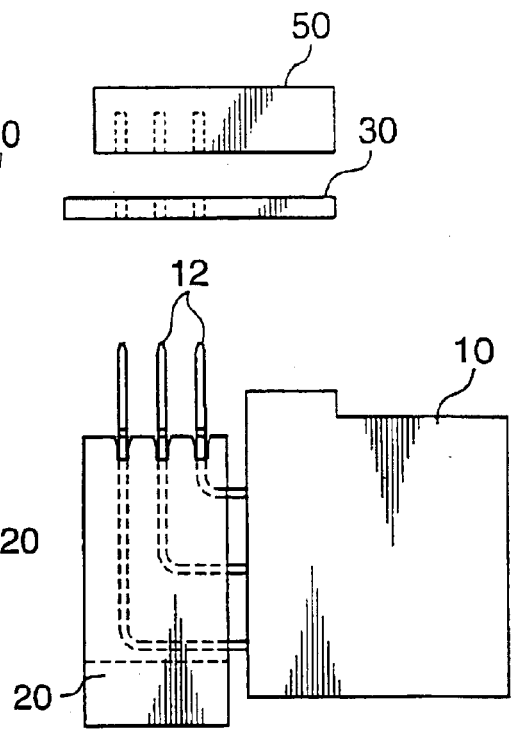

In this embodiment, the top surface of the connector jig 20 is on the same level. However, it may be appreciated to raise the top level of the projections between the back and forth positioning grooves 24 as advancing in the backward direction as shown in FIG. 2F. In other words, the top level of more rearward projections is higher than that of more forward projections. This construction makes it easier to position or align the terminals in both the widthwise direction and the back and forth direction because the connector jig 20 is moved in the terminals 12 gradually from terminals 12 near to the connector housing 11 which have shorter horizontal parts toward terminals 12 farther away from the connector housing 11 which have longer horizontal parts.

Referring to FIGS. 3A and 3B showing a press-fitting apparatus using the connector jig 20, a press-fitting apparatus 100 is provided with a sliding table 102 movable in widthwise and back and forth directions of the connector jig 20 mounted on a base block 101, and a floating table 103 movable in widthwise and back and forth directions of the connector jig 20 on the sliding table 102.

The press-fitting apparatus 100 includes a connector support member 104 for setting the press fit connector 10 thereon, and an elevating mechanism 105 for moving the connector jig 20 up and down relative to the press fit connector 10 set on the connector support member 104. An end of the printed circuit board 30 is supported on the sliding table 102 by way of the connector jig 20 and the relevant elements.

Substrate positioning pins 106 are provided on left and right ends of the floating table 103 as shown in FIG. 3A, respectively. These substrate positioning pins 106 serve to support the other end of the printed circuit board 30.

The press-fitting apparatus 100 further includes a press mechanism 107. The press-fitting apparatus 100 has a bridging portion 107b, which is supported by upstanding leg portions 107a provided at respective four corners of the base block 101, and is movable up and down. The substrate jig 50 is suspended on the bridging portion 107b of the press mechanism 107 with openings of the blind holes 52 thereof facing downward.

In FIGS. 3A and 3B, the respective terminals 12 are press fitted into the printed circuit board 30 by opposing the printed circuit board 30 and the respective terminals 12 of the press fit connector 10 to one another in a state that the backside surface of the printed circuit board 30 is rendered in pressing contact with the substrate jig 50, and the respective terminals 12 of the press fit connector 10 are supported in the connector jig 20, and then pressingly moving the substrate jig 50 downward.

A driving mechanism comprised of the sliding table 102, the floating table 103, the elevating mechanism 105, and the press mechanism 107 is driven by a hydraulic or electric motor. Operations of these driving elements are controlled by a control device.

FIGS. 4A through 9B show procedures as to how the respective components of the press fit connector 10 are press fitted into the printed circuit board 30 with use of the press-fitting apparatus 100. First, the printed circuit board 30 and the connector 10 are set at predetermined positions after being loaded at predetermined loading positions shown by the phantom line in FIG. 3B by moving the sliding table 102 and the floating table 103 of the press-fitting apparatus 100 in the direction shown by the hollow arrow in FIG. 3B, and then moving the sliding table 102 and the floating table 103 backward opposite to the arrow direction.

After the respective terminals 12 of the press fit connector 10 are temporarily supported in the connector jig 20 by moving the connector jig 20 upward toward the press fit connector 10, as shown in FIGS. 1A and 1B, the temporary support state is held for a while. Then, the connector jig 20 supported on the elevating mechanism 105, is moved further upward to position and receive the terminals 12 into predetermined positions in the connector jig 20.

As shown in FIGS. 8A through 9B, subsequently, the horizontal part and the lower section of the vertical part of each terminal 12 come into the widthwise positioning groove 23 after being guided along the fourth, third, second surfaces 23d, 23c, and 23b, while the flange 12b of the terminal 12 comes into the corresponding back and forth positioning groove 24 after being guided along the second and first surfaces 24c and 24b. After the widthwise and back and forth alignments, the connector 10 is supported in the connector jig 20 in the state shown in FIGS. 4A and 4B.

In this way, with use of the connector jig 20, the respective terminals 12 are accurately positioned in the widthwise and back and forth directions of the connector jig 20 with the flanges 12b being abutted against the bottom surfaces 24a of the back and forth positioning grooves 24 without use of an alignment plate, which is an additional component other than the housing of a press fit connector in the conventional arrangement. The connector jig 20 is advantageous in eliminating an alignment plate, consequently reducing the costs relating to producing or molding and assembling this component.

The connector jig 20, which eliminates any alignment plate, makes it less likely that the resilient portion 12a of the terminal 12 comes off from the through connection hole 31 of the printed circuit board 30 under a severe environment of use such as vibrations and a great temperature difference, thereby providing improved reliability of the press fit connector 10. This is advantageous in a press fit connector 10 adapted for an automotive vehicle. Also, the arrangement secures press-fitting of terminals 12 of a press fit connector 10 into a substrate at a low cost and with improved reliability.

Figure 5A:
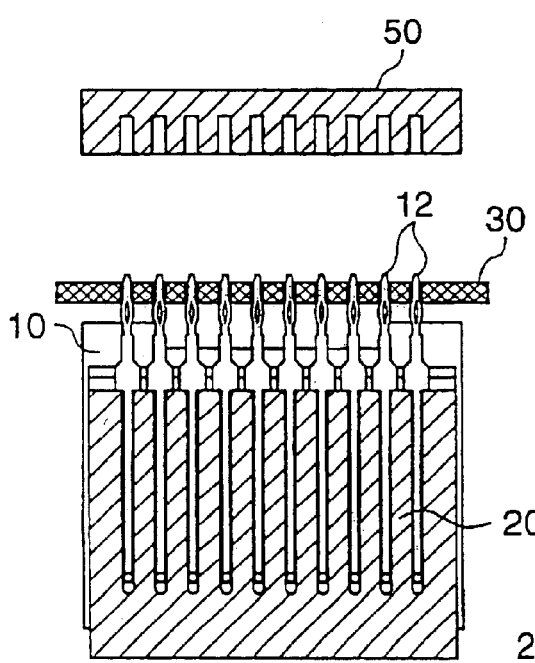
Figure 5B:
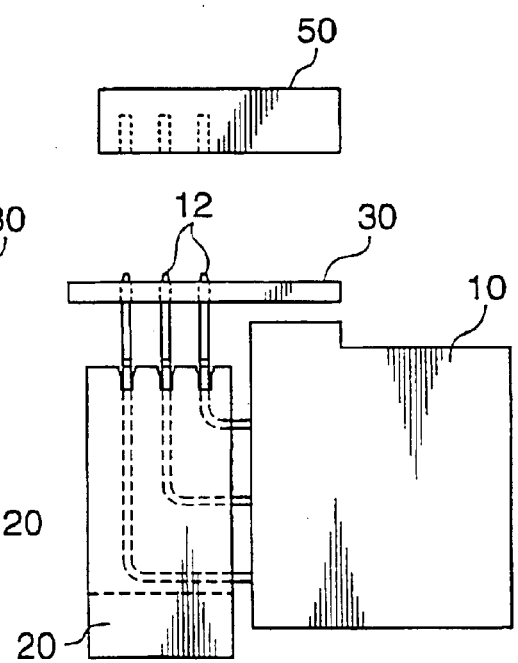
Figure 6A:
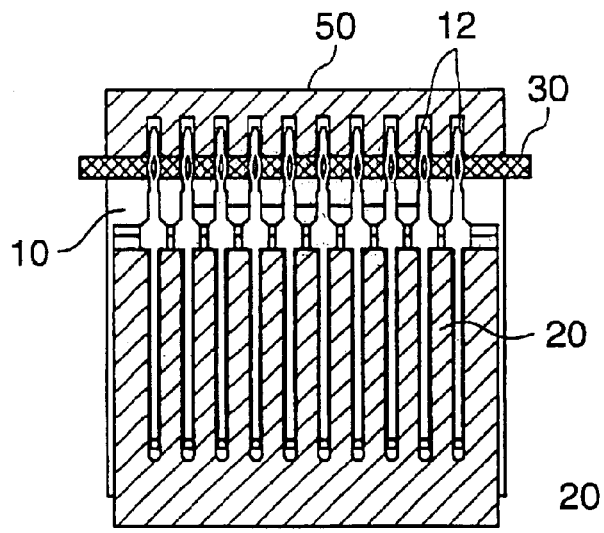
Figure 6B:
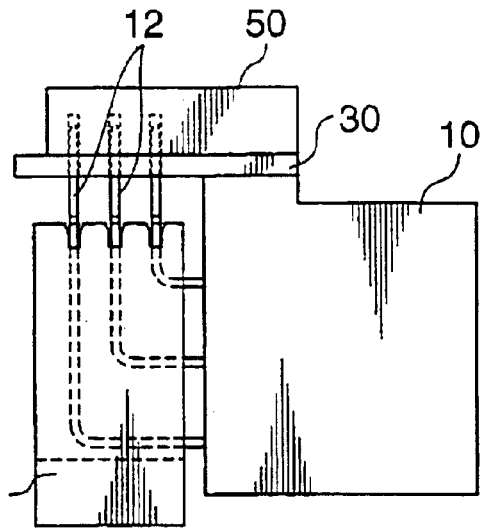
Figure 7A:
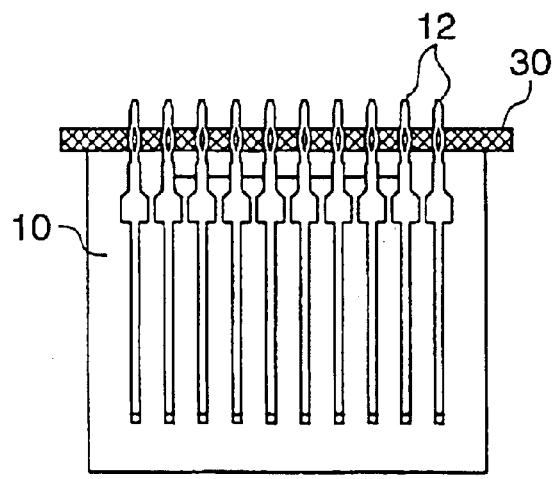
Figure 7B:
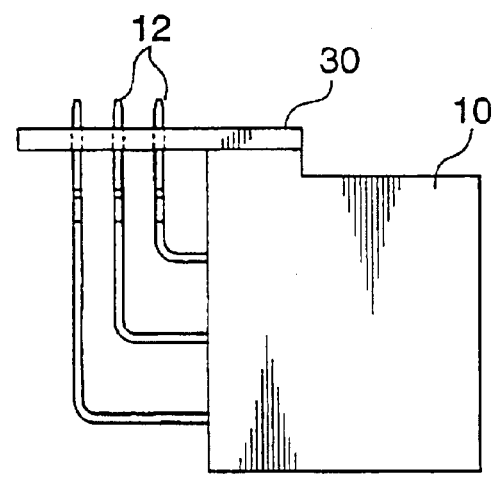
Figure 8A:
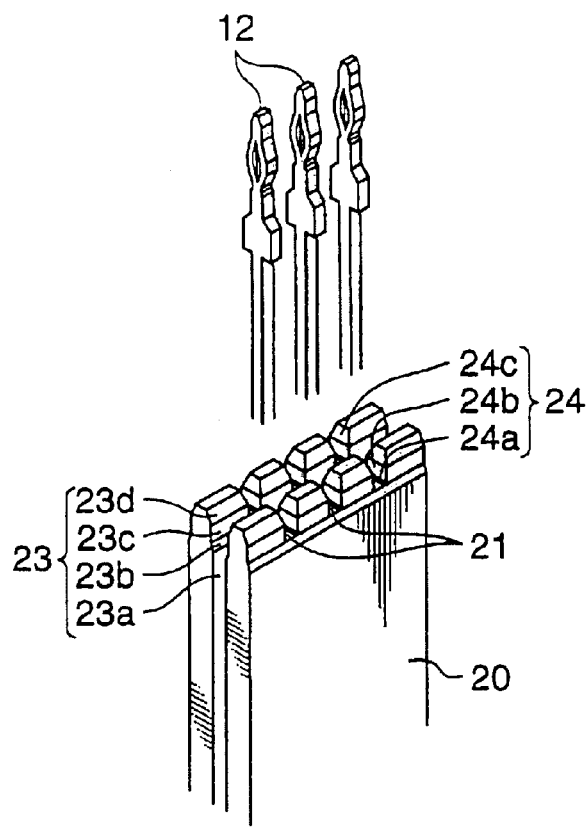
Figure 8B:
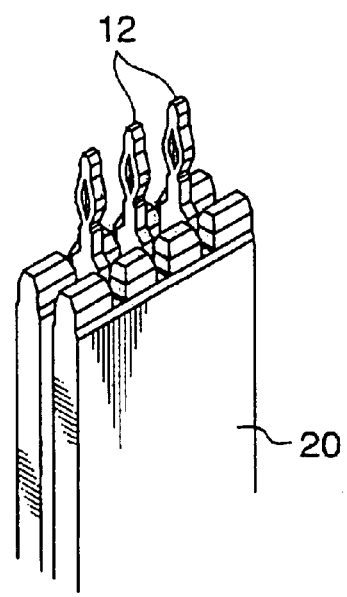
Figure 9A:
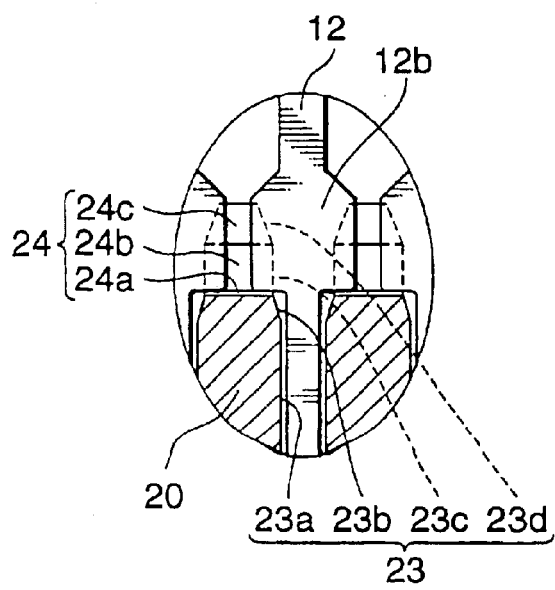
Figure 9B:
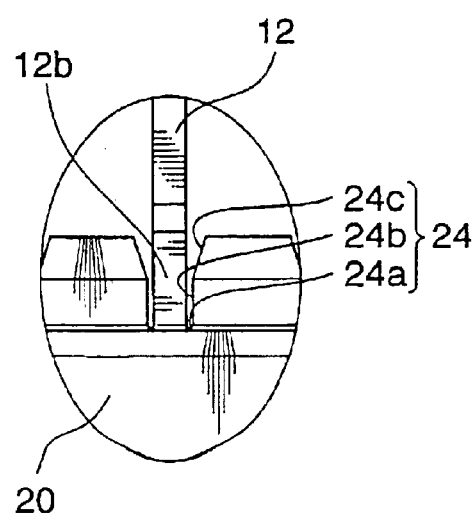
Figure 11A:
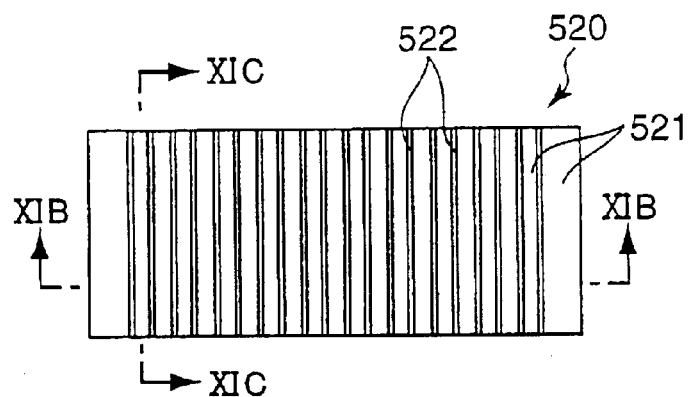
FIG. 11A is a plan view of the conventional jig.
Figure 11B:
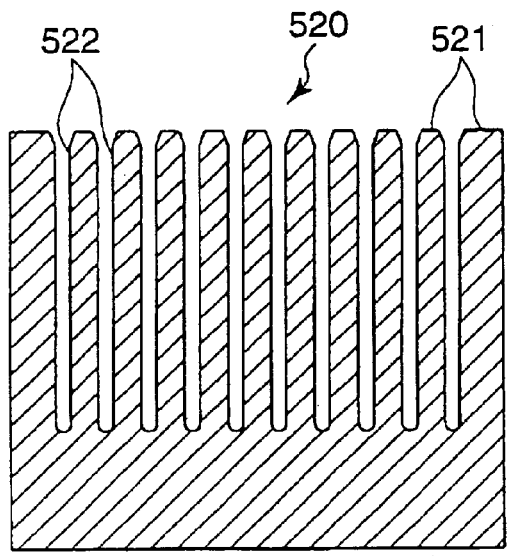
FIG. 11B is a cross section view taken along the line XIB—XIB in FIG. 11A.
Figure 11C:
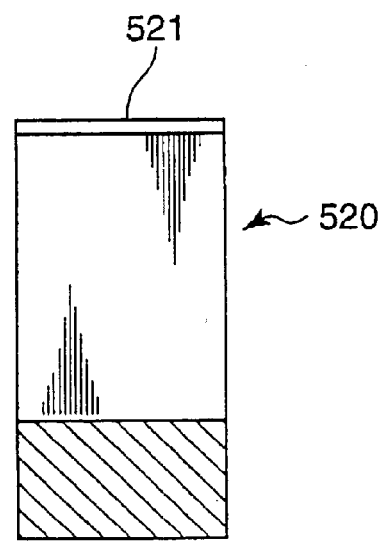
FIG. 11C is a cross sectional view taken along the line XIC—XIC in FIG. 11A.

The terminals 12 are preliminary supported by the connector jig 20 as shown in FIGS. 5A and 5B by inserting the respective tip ends of the respective terminals 12 into the through connection holes 32 of the printed circuit board 30. FIG. 3A shows this preliminary insertion state. The bridging portion 107b of the press mechanism 107 is moved downward with the substrate jig 50 in pressing contact with the backside surface of the printed circuit board 30 (see FIGS. 6A and 6B). As a result of the downward pressing movement, the resilient portions 12a of the respective terminals 12 are contracted and completely fitted in the through connection holes 32 of the printed circuit board 30. Thus, the respective terminals 12 are fixedly supported in the printed circuit board 30. Thereafter, the substrate jig 50 which has been pressingly moved downward by the press mechanism 107 is lifted upward, and the connector jig 20 supported on the elevating mechanism 105 is moved downward. Consequently, the press fit connector 10 is brought to the state shown in FIGS. 7A and 7B where the terminals 12 are perfectly press fitted in the printed circuit board 30.

With use of the press-fitting apparatus 100, desirable press-fitting is accomplished in the state that the flanges 12b of the respective terminals 12 are accurately aligned in the widthwise and back and forth directions of the connector jig 20 with the flanges 12b being placed in the back and forth positioning grooves 24 without use of an alignment plate.

In the above embodiment, the respective terminals 12 are press fitted into the printed circuit board 30 by moving the substrate jig 50 downward so as to press fit the terminals 12 of the press fit connector 10 into the printed circuit board 30 with the backside surface of the printed circuit board 30 being rendered into press contact with the substrate jig 50 in the state that the press fit connector 10 is fixedly supported on the connector jig 20, and the tip ends of the respective terminals 12 are positioned to the printed circuit board 30. Contrary to such an arrangement, alternatively, the connector jig 20 may be moved upward to press fit the terminals 12 of the connector 10 into the printed circuit board 30, or both of the substrate jig 50 and the connector jig 20 are moved toward each other to press fit the terminals 12 of the connector 10 into the printed circuit board 30. Further alternatively, the substrate jig 50 and the connector jig 20 may be provided upside down contrary to the arrangement shown in FIGS. 3A and 3B. In any of the altered arrangements, similar effects and operations as in the foregoing embodiment are obtained.

In the foregoing embodiment, the back and forth positioning groove 24 is defined by the opposite vertical first surfaces 24b and the opposite slanted second surfaces 24c. Alternatively, it may be appreciated to form the first and second surfaces 24b and 24c into a single curved surface. In this modification, the height of the connector jig 20 may be lowered, which contributes to downsizing of the connector jig 20.

In the foregoing embodiment, the connector jig 20 has the metallic main body. Appling a resinous coating or its equivalent onto the jig main body is preferable in eliminating damage or breakage of the connector jig 20 at the time of press-fitting the terminals 12, which assures extension of lifespan of the connector jig 20.

In the foregoing embodiment, the connector jig 20 serving as a jig for press-fitting the terminals of the press fit connector 10, and the press-fitting apparatus 100 are described. Alternatively, the present invention is applicable to a pin connector constructed such that the respective terminals of the connector are bonded to a substrate by soldering or its equivalent. In such an alteration, application of an excessive force onto the soldered part, and generation of a crack are suppressed. Thereby, the reliability of a connector is improved.

As described above, a jig is adapted for holding terminals provided on a connector. The terminals each have a horizontal part extending in a horizontal direction from a main body of the connector and a vertical part extending in a vertical direction and connected with the horizontal part at a lower portion, and a flange at an upper portion of the vertical part.

The jig includes: a main body; a predetermined number of widthwise positioning grooves formed in the main body and arrayed in a widthwise direction of the main body, the widthwise positioning groove being adapted for holding the horizontal part and a lower portion of the vertical part of each terminal; and a predetermined number of back and forth positioning grooves formed in the main body and arrayed in a back and forth direction of the main body, the back and forth positioning groove being adapted for holding the flange of each terminal.

In this construction, the widthwise and back and forth positioning grooves assure accurate alignment of terminals in the back and forth direction as well as the widthwise direction more easily. Also, this construction can eliminate any alignment plate which conventional jigs need.

Each of the widthwise positioning grooves and the back and forth positioning grooves may be preferably formed with an introduction portion for allowing the corresponding terminal to move in the groove. The introduction portion may be preferably formed with opposite slanted surfaces to define a space whose width increases as advancing in an upper direction. The introduction portion of each grooves enables easier introduction of each terminal.

Each of the widthwise positioning grooves and the back and forth positioning grooves may be preferably formed with opposite parallel vertical surfaces below the introduction portion. The opposite parallel vertical surfaces can define a reliable terminal holding space.

A top level of a projection between adjacent back and forth positioning grooves more near to the main body of the connector may be preferably made to be higher than a top level of a projection between adjacent back and forth positioning grooves further away from the main body of the connector. Such stepwise projections enable easier and reliable holding of the terminals.

Also, an inventive press-fitting apparatus is provided with the above-mentioned connector jig for holding the terminals of the connector; a substrate support member for supporting the substrate; a substrate jig for holding the substrate at a predetermined position; a driving mechanism for driving at least one of the connector jig and substrate jig to perform press-fitting of the terminals of the connector into the connection holes of the substrate. The widthwise and back and forth positioning grooves assure accurate alignment of terminals in the back and forth direction as well as the widthwise direction more easily, eliminating any alignment plate which conventional jigs need. This results in reduction in the production costs of a press-fitting apparatus.

This application is based on Japanese Patent Application No. 2002-360240 filed on Dec. 12, 2002, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A jig for holding terminals provided on a connector, the terminals each having a horizontal part extending in a horizontal direction from a main body of the connector and a vertical part extending in a vertical direction and connected with the horizontal part at a lower portion, and a flange at an upper portion of the vertical part, the jig comprising:

a main body;

a predetermined number of widthwise positioning grooves formed in the main body and arrayed in a widthwise direction of the main body, the widthwise positioning groove being adapted for holding the horizontal part and a lower portion of the vertical part of each terminal; and a predetermined number of back and forth positioning grooves formed in the main body and arrayed in a back and forth direction of the main body, the back and forth positioning groove being adapted for holding the flange of each terminal.

2. The jig according to claim 1, wherein each of the widthwise positioning grooves and the back and forth positioning grooves is formed with an introduction portion for allowing the corresponding terminal to move in the groove.

3. The jig according to claim 2, wherein the introduction portion includes opposite slanted surfaces defining a space whose width increases as advancing in an upper direction.

4. The jig according to claim 3, wherein each of the widthwise positioning grooves and the back and forth positioning grooves includes opposite parallel vertical surfaces below the introduction portion.

5. The jig according to claim 1, wherein a top level of a projection between adjacent back and forth positioning grooves more near to the main body of the connector is higher than a top level of a projection between adjacent back and forth positioning grooves further away from the main body of the connector.

6. The jig according to claim 5, wherein each of the widthwise positioning grooves and the back and forth positioning grooves is formed with an introduction portion for allowing the corresponding terminal to move in the groove.

7. The jig according to claim 6, wherein the introduction portion includes opposite slanted surfaces defining a space whose width increases as advancing in an upper direction.

8. The jig according to claim 7, wherein each of the widthwise positioning grooves and the back and forth positioning grooves includes opposite parallel vertical surfaces below the introduction portion.

9. A press fitting apparatus for press fitting terminals provided on a connector into corresponding connection holes formed in a substrate, the terminals each having a horizontal part extending in a horizontal direction from a main body of the connector and a vertical part extending in a vertical direction and connected with the horizontal part at a lower portion, and a flange at an upper portion of the vertical part, the press fitting apparatus comprising:

a connector jig for holding the terminals of the connector;

a substrate support member for supporting the substrate;

a substrate jig for holding the substrate at a predetermined position;

a driving mechanism for driving at least one of the connector jig and substrate jig to perform press-fitting of the terminals of the connector into the connection holes of the substrate;

wherein the connector jig includes:

a main body;

a predetermined number of widthwise positioning grooves formed in the main body and arrayed in a widthwise direction of the main body, the widthwise positioning groove being adapted for holding the horizontal part and a lower portion of the vertical part of each terminal; and a predetermined number of back and forth positioning grooves formed in the main body and arrayed in a back and forth direction of the main body, the back and forth positioning groove being adapted for holding the flange of each terminal.

10. The press fitting apparatus according to claim 9, wherein each of the widthwise positioning grooves and the back and forth positioning grooves is formed with an introduction portion for allowing the corresponding terminal to move in the groove.

11. The press fitting apparatus according to claim 10, wherein the introduction portion includes opposite slanted surfaces defining a space whose width increases as advancing in an upper direction.

12. The press fitting apparatus according to claim 11, wherein each of the widthwise positioning grooves and the back and forth positioning grooves includes opposite parallel vertical surfaces below the introduction portion.

13. The press fitting apparatus according to claim 9, wherein a top level of a projection between adjacent back and forth positioning grooves more near to the main body of the connector is higher than a top level of a projection between adjacent back and forth positioning grooves further away from the main body of the connector.

14. The press fitting apparatus according to claim 13, wherein each of the widthwise positioning grooves and the back and forth positioning grooves is formed with an introduction portion for allowing the corresponding terminal to move in the groove.

15. The press fitting apparatus according to claim 14, wherein the introduction portion includes opposite slanted surfaces defining a space whose width increases as advancing in an upper direction.

16. The press fitting apparatus according to claim 15, wherein each of the widthwise positioning grooves and the back and forth positioning grooves includes opposite parallel vertical surfaces below the introduction portion.

* * * * *